United States Patent [19]

Frey

[11] Patent Number: 5,710,520

[45] Date of Patent: Jan. 20, 1998

[54] PULSE STEP MODULATOR AND TRANSFORMER

[75] Inventor: Richard Barry Frey, Quincy, Ill.

[73] Assignee: Harris Corporation, Melbourne, Fla.

[21] Appl. No.: 673,260

[22] Filed: Jun. 28, 1996

[51] Int. Cl.$^6$ ............................................. H03F 3/38
[52] U.S. Cl. ............................................. 330/10; 330/171
[58] Field of Search ................................ 330/10, 207 A, 330/251, 165, 171; 332/106, 107

[56] References Cited

U.S. PATENT DOCUMENTS

| | | | |
|---|---|---|---|
| 4,403,197 | 9/1983 | Swanson | 330/10 |
| 4,560,944 | 12/1985 | Furrer | 330/10 |
| 5,309,114 | 5/1994 | Swanson | 330/10 |
| 5,392,007 | 2/1995 | Cripe | 330/10 X |

*Primary Examiner*—Steven Mottola
*Attorney, Agent, or Firm*—Tarolli, Sundheim, Covell, Tummino & Szabo

[57] ABSTRACT

A pulse step modulator is provided that includes a plurality of series connected unit step modules, each including a DC voltage source and an associated actuatable switching means for, when actuated, turning ON the associated module to provide a unit step voltage. An output circuit is connected to the series connected modules for providing an output voltage to a load wherein the magnitude of the output voltage is equal to the sum of all of the voltage sources of the modules that are turned ON. A plurality of turn ON signals are provided with each serving to actuate one of the switches in one of the modules. A transformer is provided having an elongated core which has an axis of symmetry. A primary winding is coaxially wound about the core for a substantial portion of the axial length of the core. A plurality of secondary windings are coaxially wound about the core. Each unit step module includes one of the secondary windings. A stray capacitance is associated between each secondary winding and the primary winding. This stray capacitance is minimized by employing a structure wherein each secondary winding is wound in radial and axial directions about the core axis and wherein the extent of the winding in the radial direction is substantially greater than that in the axial direction.

7 Claims, 2 Drawing Sheets

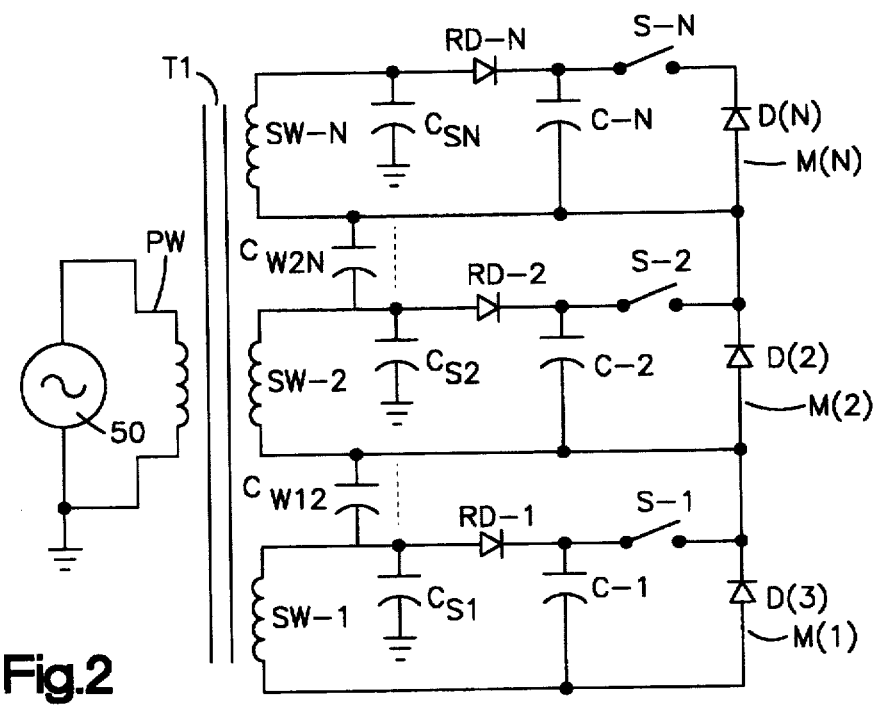
Fig.2
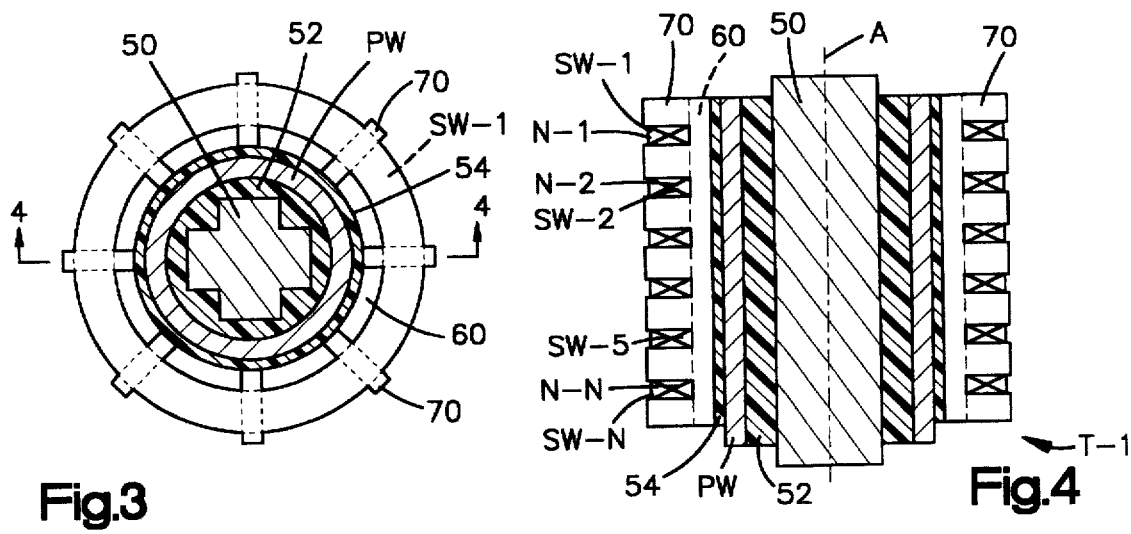
Fig.3
Fig.4
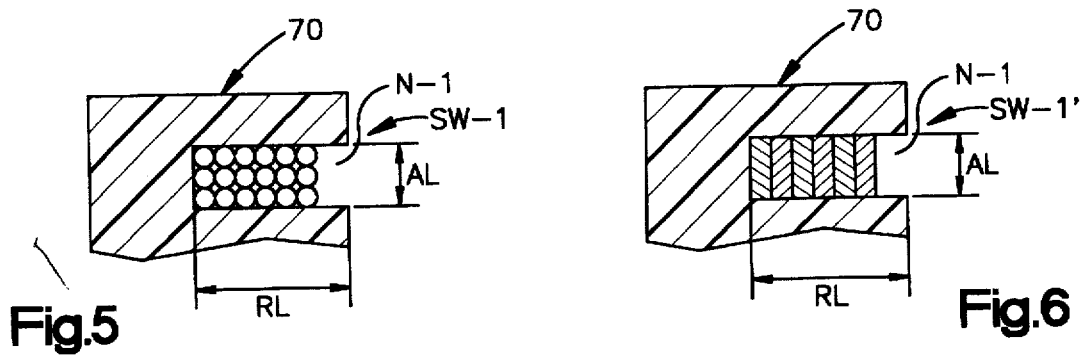
Fig.5
Fig.6

PULSE STEP MODULATOR AND TRANSFORMER

BACKGROUND OF THE INVENTION

1. Field of the Invention

The present invention is directed to the art of modulators and, more particularly, to pulse step modulators which are particularly applicable for use in AM radio broadcasting systems.

2. Description of the Prior Art

In AM radio broadcasting in the medium-wave and short-wave bands, a high-power vacuum tube is conventionally used in the final radio frequency amplifier stage of the transmitter. For maximum power-amplification efficiency, this tube is not operated as a linear amplifier, but rather as a class C or class D biased circuit, producing an RF envelope which follows that of the B+ DC supply voltage provided to the tube anode. Thus, modulation of the RF signal is achieved through varying the B+ DC supply to the plate anode of the tube. The high-powered audio amplification circuitry required to vary this voltage is referred to in the art as the modulator.

Recently, a modulator to achieve the foregoing has been employed in the art and is known as a pulse step modulator (PSM). Such a pulse step modulator is disclosed in U.S. Pat. No. 4,403,197 to H. I. Swanson. Briefly, a pulse step modulator (PSM) as disclosed in that patent includes a plurality of series connected unit step modules each of which includes an isolated DC voltage source, a remotely controlled switch and a series diode. The switch in each module may be remotely controlled to turn the module on or off. As each module is turned on, it provides a step voltage. As the various modules are turned on in a stepwise fashion, the output voltage will increase in steps from 0 volts to a maximum voltage with the maximum equalling the sum of all of the module DC voltage sources. A lowpass filter at the output may be employed for removing switching noise. An encoder or the like monitors a time varying input signal, such as an audio signal, and turns on one of the unit step modules for each incremental increase in the value of the audio signal. As the audio signal continues to increase in value, the modules are turned on one at a time in a given order. Similarly, as the audio signal decreases in value, the modules are sequentially turned off in the reverse order.

The U.S. Patent to A. Furrer U.S. Pat. No. 4,560,944 also discloses a pulse step modulator similar to that as described above.

Such prior art pulse step modulators typically include a transformer having a primary winding and a plurality of secondary windings each associated with one of the unit step modules. It is important that stray capacitance between the secondary windings and the primary winding be kept to a minimum. The capacitance between each secondary winding and ground defines the module to ground capacitance. The cumulative effects of this capacitance over the several modules in a pulse step modulator causes the performance of the modulator to be degraded in several ways. One way is the switching losses encountered while increasing the energy needed to charge the stray capacitance each time a module is turned ON. A second way is by increasing the discharge RC time constant formed by the load resistance and the stray capacitance. Typically, the load is the only mechanism through which the output voltage is discharged once one or several modules have been turned OFF. The discharge RC time constant is fixed by the stray capacitance and the magnitude of the load resistance. Also, the effect of a long discharge RC time constant is to cause the total harmonic distortion of the desired signal to increase as the frequency (period) of the desired waveform approaches the load-stray RC time constant. This is generally referred to as "diagonal clipping".

SUMMARY OF THE INVENTION

It is an object of the present invention to provide an improved pulse modulator having a transformer which employs secondary windings configured in a manner to minimize the magnitude of the stray capacitance between each secondary winding and the primary winding.

In accordance with the invention, a pulse step modulator is provided that includes a plurality of series connected unit step modules, each including a DC voltage source and an associated actuatable switching means for, when actuated, turning ON the associated module to provide a unit step voltage. An output circuit is connected to the series connected modules for providing an output voltage to a load wherein the magnitude of the output voltage is equal to the sum of all of the voltage sources of the modules that are turned ON. A plurality of turn ON signals are provided with each serving to actuate one of the switches in one of the modules. A transformer is provided having an elongated core which has an axis of symmetry. A primary winding is coaxially wound about the core for a substantial portion of the axial length of the core. A plurality of secondary windings are coaxially wound about the core. Each unit step module includes one of the secondary windings. A stray capacitance is associated between each secondary winding and the primary winding. This stray capacitance is minimized by employing a structure wherein each secondary winding is wound in radial and axial directions about the core axis and wherein the extent of the winding in the radial direction is substantially greater than that in the axial direction.

BRIEF DESCRIPTION OF THE DRAWINGS

The foregoing and other objects and advantages of the invention will become more readily apparent from the following description as taken in conjunction with the accompanying drawings, wherein:

FIG. 2 is a schematic illustration representative of the electrical circuitry employed for each unit step module employed in practicing the invention;

FIG. 3 is a planar top view illustrating a single phase transformer having a primary winding and secondary windings constructed in accordance with the invention; and FIG. 4 is a sectional view taken along line 4—4 looking in the direction of the arrows of FIG. 3.

FIG. 5 is an enlarged sectional view of a portion of an insulator support; and

FIG. 6 is similar to FIG. 5 but showing an alternative embodiment.

DESCRIPTION OF THE PREFERRED EMBODIMENTS

Figure 1:
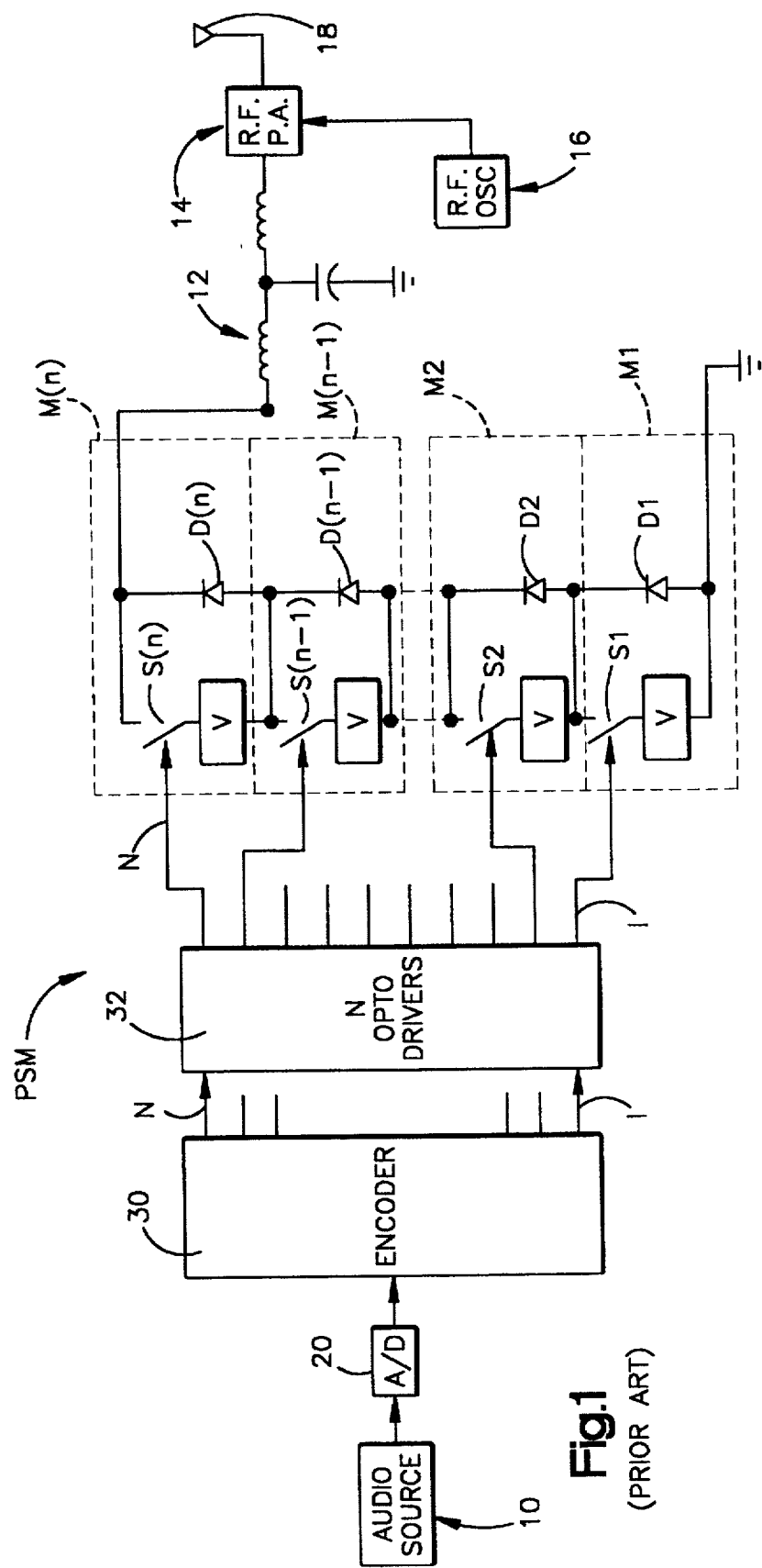
FIG. 1 is a schematic-block diagram illustration of a prior art AM broadcasting transmitter employing a pulse step modulator (PSM)

Reference is now made to the drawings wherein the showings are for purposes of illustrating a preferred embodiment of the invention only and not for purposes of limiting same. FIG. 1 illustrates an AM transmitter which incorporates a pulse step modulator (PSM). The transmitter includes an audio source 10 which generates an amplitude and frequency varying audio signal which is to be amplified and transmitted. This signal is supplied by way of a conventional analog-to-digital converter 20 to a pulse step modulator (PSM). The pulse step modulator, to be described in greater detail hereinafter, amplifies the signal to a high power level and provides a resulting amplitude signal $V^{out}$ to a low pass filter 12. The resulting amplified and filtered signal is then supplied to the audio input of a conventional RF power amplifier 14 where it amplitude modulates an RF carrier signal supplied by an RF oscillator 16. The resulting AM signal is then transmitted by a conventional antenna 18.

The analog-to-digital converter 20 receives the analog audio signal from the audio source 10 and converts it into a multi-bit digital representation thereof. For example, the analog input signal may be converted into a 12 bit digital signal. The six most significant bits (6 MSB) are supplied to a decoder 30 having N output circuits which are supplied to an optical driver circuit 32. Circuit 32 has N output circuits respectively connected to N unit step switches S1 through SN. Switches S1 through SN are respectively located in unit step modules M1 through M(N). The encoder 30 sequentially energizes its output circuits 1 through N with incremental increases in the magnitude of the analog signal and de-energizes the output circuits in the reverse order with incremental decreases in the magnitude of the analog signal. These are reflected through the optical driver circuit 32. The optical driver circuit has output circuits 1 through N which serve to sequentially close switches S1 through SN as the analog input signal incrementally increases in magnitude and to sequentially open the switches, in the reverse order, as the input analog signal incrementally decreases in magnitude. Whenever a switch S1 through SN is open, the associated unit step module is turned off and whenever a switch is closed, the associated unit step module is turned on.

Each unit step module M1 through M(N) includes an incremental unit step voltage source V, a switch such as switch S1 and a diode such as diode D1 all interconnected as shown with respect to module M1 in FIG. 1. The unit step modules are connected together in series with diodes D1 through D(N). Each incremental voltage source may be considered as a DC voltage source of a fixed magnitude which, in practice, may be on the order of 600 volts. The total voltage across the series connected modules is dependent upon the number of modules which have been turned on by closure of the associated switches S1 through S(N). For example, if all of the switches S1 through SN are closed, then all of the unit step voltage sources V are connected together in series and added together to provide an output voltage NV. If each unit step voltage source V has a value on the order of 600 volts and N is on the order of 50, then the total voltage may be on the order of 30,000 volts.

Reference is now made to FIG. 2 which illustrates in greater detail modules M1, M2 and M(N) shown in FIG. 1. Here, however, each voltage source is represented by a secondary winding located on a transformer T1 together with a diode and a capacitor. Thus, module M1 includes a secondary winding SW-1 together with a rectifying diode RD-1 and a capacitor C-1. Similarly, module M2 includes a secondary winding SW-2, a rectifying diode RD-2 and a capacitor C-2. Also, module M(N) includes a secondary winding SW-N as well as a rectifying diode RD-N and a capacitor C-N. The transformer T-1 also includes a primary winding PW which is connected across an AC voltage source 50. It is to be understood that this is a simplified illustration showing only three modules whereas in practice several modules, such as 50 modules may be employed. Also, it is to be appreciated that whereas a single phase AC supply source has been shown a three-phase supply source and a three-phase transformer may be employed.

The present invention recognizes that a major problem in the operation of pulse step modulators is stray capacitance encountered when employing conventional transformers. It is highly desirable to keep the capacitance between the individual pulse modules M1 through M(N) to ground to an absolute minimum. This is represented as the stray capacitance $C_{S1}$, $C_{S2}$, and $C_{SN}$ in FIG. 2. When such a multiple secondary winding power transformer is employed to provide power for the individual modules, the capacitance between the secondary winding to ground defines the module to ground capacitance. The cumulative effects of this capacitance ($C_{S1}$ ... $C_{SN}$) over the several modules in a pulse step modulator causes the performance to be degraded. Thus, switching losses will take place increasing the energy needed to charge the stray capacitance $C_s$ each time a module is turned ON. Also, there will be an increase in the discharge RC time constant formed between the load resistance and the stray capacitance $C_s$. It is to be noted that in a pulse step modulator as disclosed in FIGS. 1 and 2, the load is the mechanism through which the output voltage is discharged once one or several modules have been turned OFF. The discharge RC time constant is fixed by the stray capacitance and the load resistance.

In accordance with the present invention, the conventional transformer having wire wound secondary windings which extend for a substantial portion of the axial length of the core are replaced with secondary windings which extend in a radial direction by a greater amount than in an axial direction. Such a construction permits maximum use of air as an insulator providing minimum dielectric effect, thereby minimizing the magnitude of the stray capacitance $C_s$.

Reference is again made to FIG. 2 and more specifically to the transformer T1. This transformer is illustrated as having a primary winding PW and a multiple secondary windings SW-1 through SW-N. In accordance with the present invention, this transformer has been optimized in order to minimize the magnitude of the stray capacitances $C_{S1}$ through $C_{SN}$. This is accomplished with the use of a transformer having secondary windings constructed as more particularly shown in FIGS. 3 through 6. A transformer having secondary windings constructed in this manner may be obtained from Olsun Electrics Corporation of Richmond, Ill. 60071-0001 and known as their Model 21654. In one practical embodiment, this particular transformer may take the form as a three-phase transformer having three cores each constructed as described herein with reference to FIGS. 3 through 6.

As will be appreciated from the discussion that follows, the secondary windings SW-1 through SW-3 of the transformer T1 extend coaxially about a core with each secondary winding extending in a radial distance greater than that of its axial distance. This is sometimes known in the art as a "disk wound" transformer construction and, for example, may include a copper tape or the like with the tape wound coaxially about the core with each layer being wound upon itself in a radial or spiral manner for the necessary number of turns. Since each winding extends for an axial distance substantially less than its radial distance, the capacitance between each secondary winding and ground will be drastically reduced over conventional practice wherein a secondary winding extends in an axial distance which is greater than its radial distance. This arrangement produces a minimum capacitance between the primary and secondary windings or between each secondary winding and ground (it is to be noted that the primary winding PW in FIG. 2 is grounded).

FIGS. 3 and 4 illustrate one phase of such a transformer including a primary winding PW and multiple secondary windings SW-1 through SW-N in accordance with the present invention. The transformer includes a core 50 which, in the conventional fashion, may be a laminated structure of high permeability steel. Its cross section as shown in FIG. 3, is quasi-round and is surrounded with an insulating layer 52. This insulating layer has a circular outer face which extends coaxially about the core throughout its axial length. The primary winding PW may take the form of an elongated copper wire which in a conventional manner, is coaxially wound about the insulating layer 52 and extends for the axial length of the core 50. Such a winding includes an elongated wire which is wound about the core in a manner similar to a thread wound on a thread spool. An insulating barrier 54, which may take the form of a sleeve-like structure, coaxially encircles the primary winding PW and extends axially for the length of the core 50.

An annular pocket 60 of air (see FIG. 3) coaxially surrounds the insulating barrier 54 and this pocket of air extends axially for the length of the core 50. This pocket is surrounded by the secondary windings SW-1 through SW-N. The secondary windings are supported by a plurality of insulator supports 70. These insulator supports, as best shown in FIGS. 4, 5 and 6, each take the form of an elongated comb-type structure provided with notches N-1 through N-N for respectfully supporting and carrying primary windings SW-1 through SW-N. The number of supports 70 employed is kept to a minimum, there being only a sufficient number of such supports as necessary to keep the secondary windings in place coaxially about the core 50. The maximum use of air is made as the dielectric in the angular pocket. In the example being illustrated, eight supports are employed. Fewer or more supports may be employed as required.

It is to be noted that the supports 70 are arranged in an annular array about the core 50 with the corresponding notches in the supports serving to support the same secondary winding. That is, for example, notch N-1 in each of the supports 70 serves to receive and carry the secondary winding SW-1. Similarly, the notches N-2 serve to receive and carry the secondary winding SW-2 and so on.

Reference is now made to FIG. 5 which is an enlarged sectional view showing a portion of a support 70 together with a notch N-1 containing a secondary winding SW-1. In this configuration, it is to be noted that radial length RL of each notch is substantially greater than its axial length AL. The secondary winding SW-1 substantially fills the notch and in the embodiment of FIG. 5, the winding is shown as including an elongated wire, such as a copper wire which is circular in cross section, which extends for six turns in a radial direction relative to the axis A-A' of the core and extends in an axial direction by three turns.

In the embodiment of FIG. 6, it is contemplated that the secondary winding SW-1' is constructed of an elongated ribbon-like copper tape having a width corresponding the axial length of notch N-1 with the tape being wound helically or spirally through corresponding notches N-1 of the various supports 70 and coaxially about axis A-A' for several turns (six turns in the construction being illustrated). In the embodiments of FIGS. 5 and 6, the secondary winding SW-1 or SW-1' are illustrated as having a radial length which substantially exceeds the axial length of the winding. This construction results in a substantially reduced magnitude of stray capacitance $C_s$ compared to that which would take place if each secondary winding was conventional with an axial length greater than that of its radial length. Moreover, by constructing the secondary windings as described herein, the magnitude of the stray capacitance $C_s$ between each secondary winding and ground (or the grounded primary winding) is the same. That is, the magnitude of capacitor $C_{S1}$ is equal to that of capacitor $C_{S2}$ and so on.

Whereas the invention has been described in conjunction with particular embodiments, it is to be appreciated that various modifications will occur to those skilled in the art within the spirit and scope of the invention as defined by the appended claims.

Having described the invention, the following is claimed:

1. A pulse step modulator comprising:

a plurality of series connected unit step modules, each including a DC voltage source and an associated actuatable switching means for, when actuated, turning on said associated module to provide a unit step voltage;

an output circuit connected to said series connected modules for providing an output voltage to a load wherein the magnitude of the output voltage is equal to the sum of all of the voltage sources of the modules that are turned on;

means for providing a plurality of module turn on signals, each for actuating a said switching means in one of said modules;

a transformer having an elongated core having an axis of symmetry and a primary winding coaxially wound about said core for a substantial portion of the axial length of said core and a plurality of secondary windings coaxially wound about said core;

each said unit step module including one of said secondary windings, each said secondary winding exhibiting an associated stray capacitance between said secondary winding and said primary winding;

means for minimizing said stray capacitance wherein each said secondary winding is wound in radial and axial directions about said core axis wherein the extent of said winding in said radial direction is substantially greater than that in said axial direction.

2. A pulse step modulator as set forth in claim 1 wherein each said secondary winding includes an elongated wire which is coaxially wound about said axis in a radial direction as well as in an axial direction with the extent of said winding in said radial direction being substantially greater than that in said axial direction.

3. A pulse step modulator as set forth in claim 1 wherein each said secondary winding includes an elongated tape-like conductor wound spirally about said axis in a radial direction outwardly therefrom with the width of said conductor in said axial direction being substantially less than the extent said winding extends in said radial direction away from said axis.

4. A pulse step modulator as set forth in claim 1 including secondary winding support means having a plurality of axially spaced winding support notches each extending in a radial direction outwardly from said axis and wherein each said notch extends in an axial direction by an extent which is substantially less than the extent in said radial direction.

5. A pulse step modulator as set forth in claim 4 wherein each said secondary winding includes an elongated wire which is coaxially wound about said axis in a radial direction, as well as in an axial direction with the extent of said winding in said radial direction being substantially greater than that in said axial direction.

6. A pulse step modulator as set forth in claim 4 wherein each said secondary winding includes an elongated tape-like conductor wound spirally about said axis in a radial direction outwardly therefrom with the width of said conductor in said axial direction being substantially less than the extent said winding extends in said radial direction away from said axis.

7. A pulse step modulator as set forth in claim 4 including a plurality of said secondary winding support means arranged in a circular array which extends coaxially about said core.

* * * * *